United States Patent
Huang

(10) Patent No.: US 9,257,194 B1
(45) Date of Patent: Feb. 9, 2016

(54) DRAIN REGULATOR FOR NOR FLASH MEMORY

(71) Applicant: Winbond Electronics Corp., Taichung (TW)

(72) Inventor: Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/552,107

(22) Filed: Nov. 24, 2014

(51) Int. Cl.
*G11C 16/04* (2006.01)
*G11C 16/30* (2006.01)
*G11C 5/14* (2006.01)
*G11C 16/12* (2006.01)
*G11C 16/10* (2006.01)
*G11C 16/28* (2006.01)

(52) U.S. Cl.
CPC ............... *G11C 16/30* (2013.01); *G11C 5/147* (2013.01); *G11C 16/10* (2013.01); *G11C 16/12* (2013.01); *G11C 16/28* (2013.01); *G11C 16/0483* (2013.01)

(58) Field of Classification Search
CPC ........ G11C 16/10; G11C 16/12; G11C 16/28; G11C 16/30; G11C 16/0483
USPC .................. 365/185.18, 185.21, 226
See application file for complete search history.

(56) References Cited

U.S. PATENT DOCUMENTS

| 7,085,190 | B2 * | 8/2006 | Worley | G11C 11/4085 365/189.11 |
| 7,489,566 | B2 * | 2/2009 | Kang | G11C 5/145 327/536 |
| 7,532,531 | B2 * | 5/2009 | Lee | G11C 5/147 365/185.18 |
| 7,548,466 | B2 * | 6/2009 | Park | G11C 8/08 365/189.09 |
| 7,940,117 | B2 * | 5/2011 | Jeon | G11C 5/145 327/535 |

* cited by examiner

*Primary Examiner* — Pho M Luu
(74) *Attorney, Agent, or Firm* — Muncy, Geissler, Olds & Lowe, P.C.

(57) ABSTRACT

A drain regulator for a NOR flash memory includes a pump source, a pass transistor, a voltage divider, a Y-path gate, an amplifier, and a current detector. The pump source is configured to pump a supply voltage to a high voltage at a HV node. The pass transistor is coupled between the HV node and a bit line. The pass transistor is controlled by a control signal to generate a bit-line voltage at the bit line. The voltage divider divides the bit-line voltage by a factor to generate a feedback voltage at a feedback node. The Y-path gate biases the selected cell with a drain voltage. The amplifier supplied with the HV voltage compares the feedback voltage with a reference voltage to generate the control signal. The current detector senses a current flowing through the Y-path gate to generate a sense signal to the feedback node.

12 Claims, 6 Drawing Sheets

DRAIN REGULATOR FOR NOR FLASH MEMORY

BACKGROUND OF THE INVENTION

1. Field of the Invention

The disclosure relates generally to a drain regulator for a NOR flash memory, and more particularly to a drain regulator providing a constant output voltage for efficiently programming the selected cell of a NOR flash memory.

2. Description of the Related Art

Memory devices are typically provided as internal, semiconductor, integrated circuits in computers and other electronic devices. There are many different types of memory, including random-access memory, read only memory, dynamic random access memory, synchronous dynamic random access memory, and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants, digital cameras, and cellular telephones. Program code and system data such as a basic input/output system are typically stored in flash memory devices for use in personal computer systems.

As electronic systems and software become more complex, they require additional memory capacity. However, as flash memory device sizes increase, the time and power required to program the memory also increases. This can decrease system performance.

NOR-type flash memory devices typically use a Channel Hot Electron (CHE) method of programming CHE involves a high current on the bit line and through the cell, between the drain and source, which is being programmed. The bit line current also consists of the sum of the parasitic current from all other cells on the same bit line, which are intended to be in an "OFF" state and yet still leak some current. The current leakage increases overall current draw from the bit line charge pump and also increases the voltage drop in the bit line path due to the additional IR drop. This results in lower programming efficiency.

For the reasons stated above, there is a need in the art for more efficient programming of a flash memory transistor.

BRIEF SUMMARY OF THE INVENTION

For solving above problems, the invention provides a drain regulator outputting a constant programming voltage for the programmed cell in a flash memory and makes the program performance more efficient.

In an embodiment, a drain regulator for a NOR flash memory comprises a pump source, a pass transistor, a voltage divider, a Y-path gate, an amplifier, and a current detector. The pump source is configured to pump a supply voltage to a high voltage at a HV node. The pass transistor is coupled between the HV node and a bit line. The pass transistor is controlled by a control signal to generate a bit-line voltage at the bit line. The voltage divider divides the bit-line voltage by a factor to generate a feedback voltage at a feedback node. The Y-path gate is coupled between the bit line and a selected cell of the NOR flash memory and biases the selected cell with a drain voltage. The amplifier is supplied with the HV voltage and compares the feedback voltage with a reference voltage to generate the control signal. The current detector senses a current flowing through the Y-path gate to generate a sense signal to the feedback node for keeping the drain voltage constant.

In an embodiment of the drain regulator, the voltage divider comprises a first resistance unit and a second resistance unit. The first resistance unit comprises a first resistance and is coupled between the bit line and the feedback node. The second resistance unit comprises a second resistance and is coupled between the feedback node and a ground. The factor is the second resistance divided by the sum of the first resistance and the second resistance.

In an embodiment of the drain regulator, the Y-path gate is a column decoder configured to select the bit line.

In an embodiment of the drain regulator, the amplifier is an operational amplifier.

In an embodiment of the drain regulator, the pass transistor is a first N-type transistor. The current detector comprises a second N-type transistor, and a current mirror. The second N-type transistor comprises a gate terminal coupled to the control signal, a drain terminal coupled to the bit line, and a source terminal. The current mirror comprises a current sink node sinking a sink current and a current reference node sinking a reference current. The current sink node is coupled to the feedback node, and the current reference node is coupled to the source terminal of the second N-type transistor. The sink current is the reference current multiplied by a predetermined number.

In an embodiment of the drain regulator, the current mirror comprises a first P-type transistor, a third N-type transistor, and a fourth N-type transistor. The first P-type transistor comprises a gate terminal with a bias voltage applied, a drain terminal, and a source terminal coupled to the source terminal of the second N-type transistor. The third N-type transistor comprises a gate terminal coupled to a drain terminal and a source terminal coupled to a ground. The fourth N-type transistor comprises a gate terminal coupled to the gate terminal of the third N-type transistor, a drain terminal coupled to the feedback node, and a source terminal coupled to the ground.

In an embodiment, a drain regulator for a NOR flash memory comprises a pump source, a pass transistor, a voltage divider, a Y-path gate, an amplifier, and a current detector. The pump source is configured to pump a supply voltage to a high voltage at an HV node. The pass transistor is coupled between the HV node and a bit line, wherein the pass transistor is controlled by a control signal to generate a bit-line voltage at the bit line. The voltage divider divides the bit-line voltage by a factor to generate a feedback voltage at a feedback node. The Y-path gate is coupled between the bit line and a selected cell of the NOR flash memory and biases the selected cell with a drain voltage. The current flowing through Y-path gate is determined by an overdrive of the pass transistor. The amplifier is supplied with the HV voltage and compares the feedback voltage with a reference voltage to generate the control signal. The current detector senses the overdrive of the pass transistor to sink a sink current from the feedback node to a ground.

In an embodiment of the drain regulator, the voltage divider comprises a first resistance unit and a second resistance unit. The first resistance unit comprises a first resistance and coupled between the bit line and the feedback node. The second resistance unit comprises a second resistance and is coupled between the feedback node and a ground. The factor is the second resistance divided by a sum of the first resistance and the second resistance.

In an embodiment of the drain regulator, the Y-path gate is a column decoder configured to select the bit line.

In an embodiment of the drain regulator, the amplifier is an operational amplifier.

In an embodiment of the drain regulator, the pass transistor is a first N-type transistor. The current detector comprises a second N-type transistor and a current mirror. The second N-type transistor comprises a gate terminal coupled to the control signal, a drain terminal coupled to the bit line, and a source terminal. The current mirror comprises a current sink node sinking a sink current and a current reference node sinking a reference current. The current sink node is coupled to the feedback node, and the current reference node is coupled to the source terminal of the second N-type transistor. The sink current is the reference current multiplied by a predetermined number.

In an embodiment of the drain regulator, the current mirror comprises a first P-type transistor, a third N-type transistor, and a fourth N-type transistor. The first P-type transistor comprises a gate terminal with a bias voltage applied, a drain terminal, and a source terminal coupled to the source terminal of the second N-type transistor. The third N-type transistor comprises a gate terminal coupled to a drain terminal and a source terminal coupled to a ground. The fourth N-type transistor comprises a gate terminal coupled to the gate terminal of the third N-type transistor, a drain terminal coupled to the feedback node, and a source terminal coupled to the ground.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
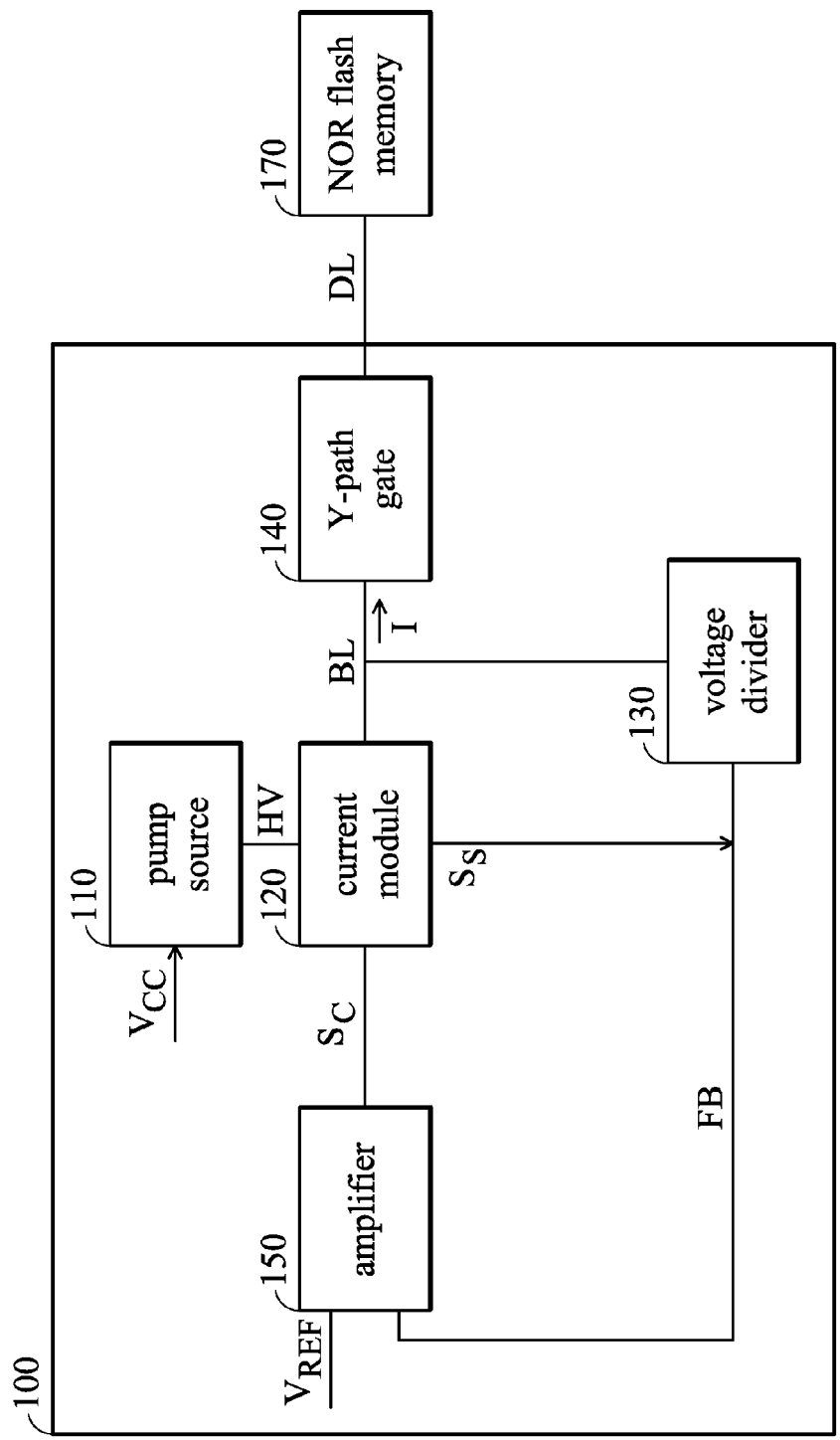
FIG. 1 is a block diagram of a drain regulator for a NOR flash memory in accordance with an embodiment of the invention.

FIG. 1 is a block diagram of a drain regulator for a NOR flash memory in accordance with an embodiment of the invention. As shown in FIG. 1, the drain regulator 100 includes the pump source 110, the current module 120, the voltage divider 130, the Y-path gate 140, and the amplifier 150. The pump source 110 is configured to pump the supply voltage $V_{CC}$ to the high voltage $V_{HV}$ at the high voltage node HV.

The current module 120 is coupled between the high voltage node HV and the bit line BL, and controlled by the control signal $S_C$ to generate the bit-line voltage $V_{BL}$ at the bit line BL. In addition, the current module 120 also senses the current I flowing through the Y-path gate 140 to generate the sense signal $S_S$ to the feedback node FB, in order to keep the drain voltage $V_D$ of the drain line DL constant for programming the selected cell of the NOR flash memory 170 by raising the bit line voltage $V_{BL}$ of the bit line BL. The drain voltage $V_D$ of the drain line DL equals the parasitic resistance R of the bit line and the Y-path gate multiplied by the current I subtracted from the bit line voltage $V_{BL}$. That is, $V_D = V_{BL} - I \times R$. The method of sensing the current I will be clearly explained in the following description.

The voltage divider 130 is configured to divide the bit line voltage $V_{BL}$ of the bit line BL to generate the feedback voltage $V_{FB}$ at the feedback node FB. The Y-path gate 140 is coupled between the bit line BL and a selected cell of the NOR flash memory 170, which biases the selected cell with the drain voltage $V_D$ of the drain line DL. The amplifier 150, to which the high voltage $V_{HV}$ is supplied, compares the feedback voltage $V_{FB}$ of the feedback node FB with the reference voltage $V_{REF}$ to generate the control signal $S_C$.

Figure 2:
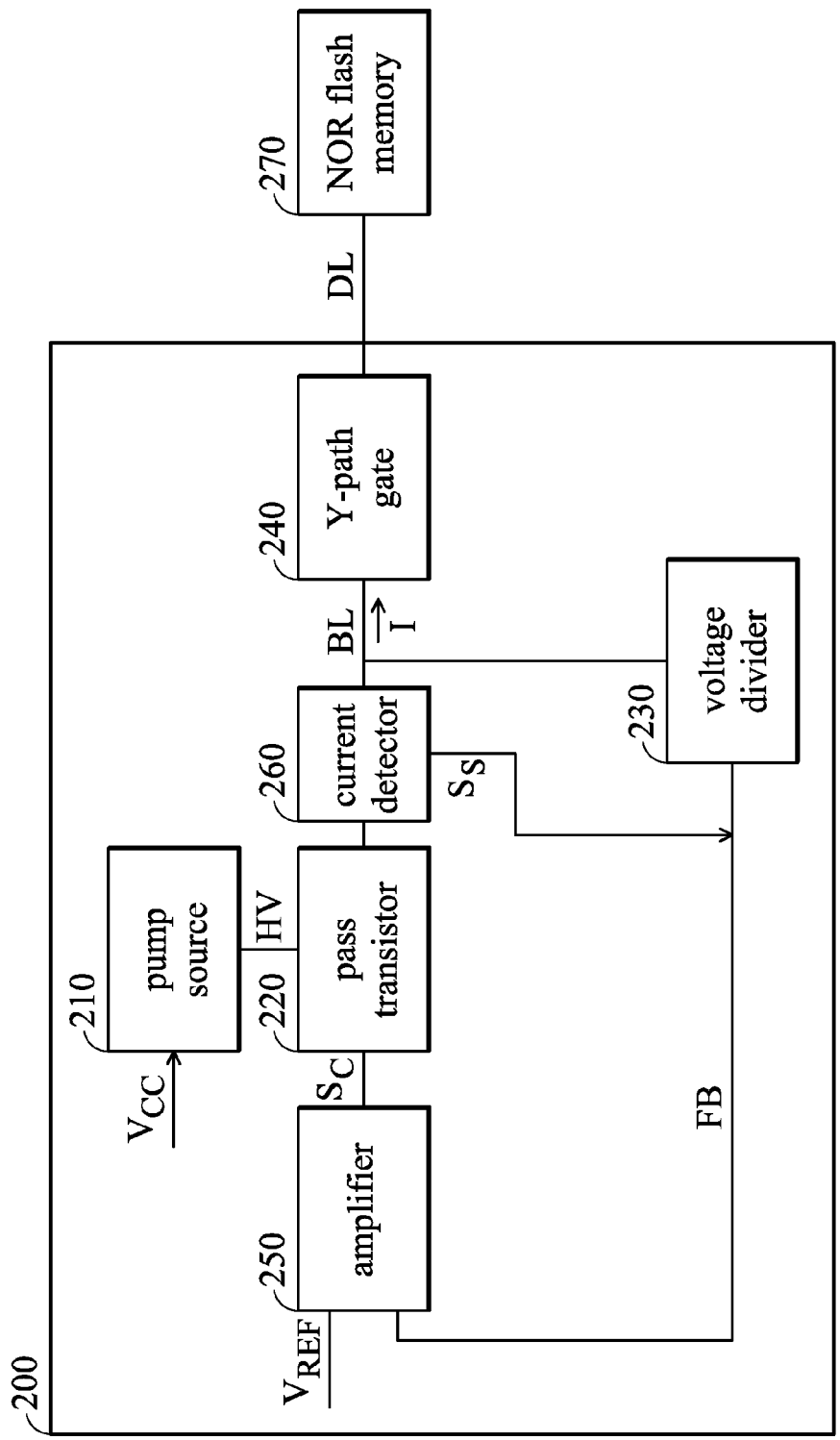
FIG. 2 is a block diagram of a drain regulator for a NOR flash memory in accordance with another embodiment of the invention.

FIG. 2 is a block diagram of a drain regulator for a NOR flash memory in accordance with an embodiment of the invention. As shown in FIG. 2, the drain regulator 200 is almost the same as the drain regulator 100 in FIG. 1. In FIG. 2, the current module 120 of FIG. 1 includes the pass transistor 220 and the current detector 260. The pass transistor 220 is coupled to the high voltage node HV and controlled by the control signal $S_C$ to generate the current I flowing through the Y-path gate 240.

The current detector 260 is coupled between the pass transistor 220 and the Y-path gate 240 to sense the current I. When the current detector 260 senses that the current I is becoming larger, it means that the drain voltage $V_D$ would be lowered by the voltage drop across the Y-path gate 240 and the bit line BL, which leads to poor program performance when programming the selected cell in the NOR flash memory 270. In order to maintain the drain voltage $V_D$ of the drain line DL, the current detector 260 outputs the sense signal $S_S$ to the feedback node FB for informing the amplifier 250 to raise the bit line voltage $V_{BL}$ and the drain voltage $V_D$ up, such that the drain voltage $V_D$ is almost remained in constant.

Figure 3:
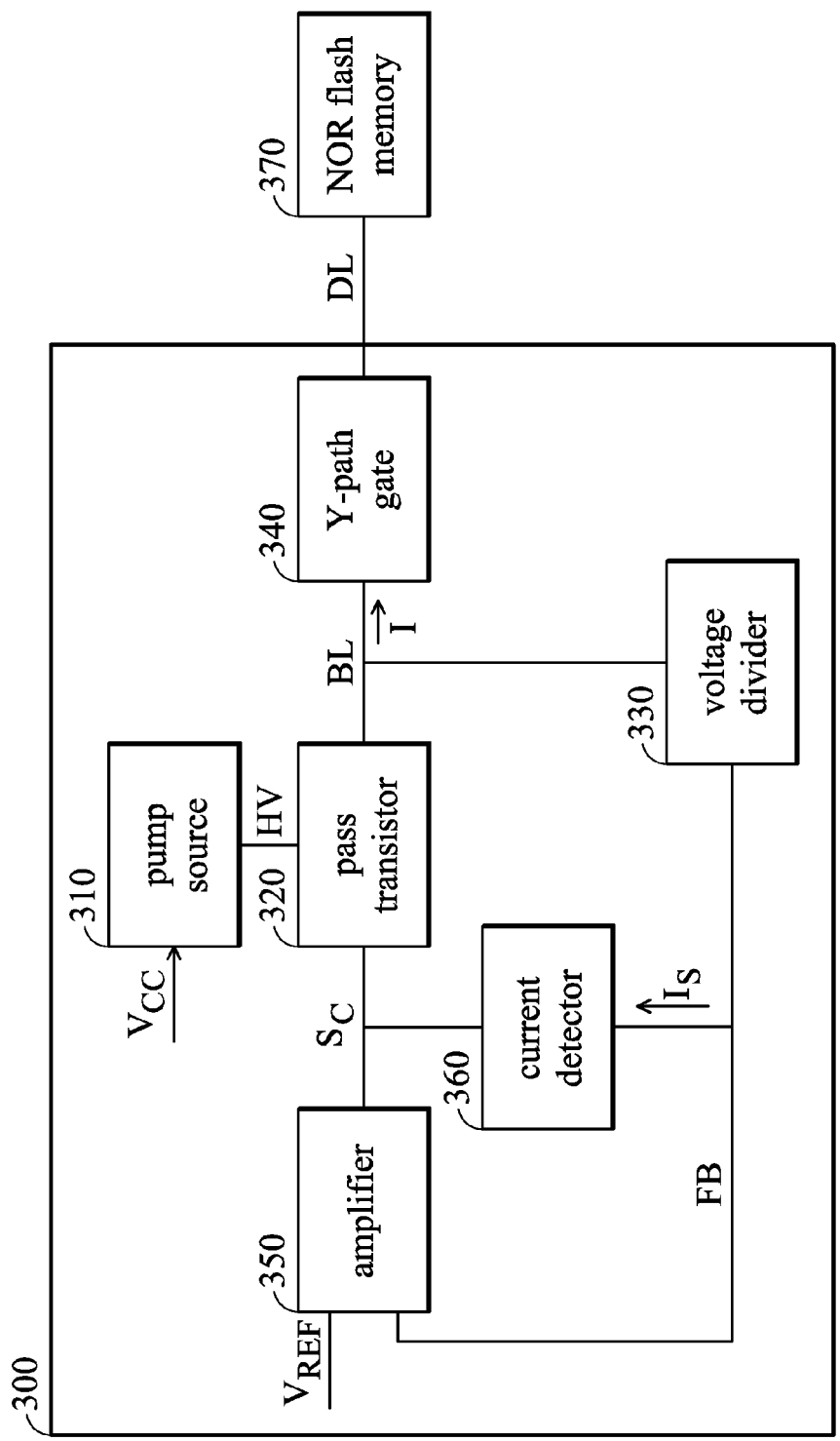
FIG. 3 is a block diagram of the drain regulator for a NOR flash memory in accordance with an embodiment of the invention.

FIG. 3 is a block diagram of a drain regulator for a NOR flash memory in accordance with another embodiment of the invention. As shown in FIG. 3, the drain regulator 300 is a little different from the drain regulator 200 in FIG. 2. The drain regulator 300 also includes the pump source 310, the pass transistor 320, the voltage divider 330, the Y-path gate 340, the amplifier 350, and the current detector 360, but the current detector 360 is a little different from the current detector 260 in FIG. 2.

According to another embodiment of the invention, the current detector 360 senses the overdrive of the pass transistor 320 to sink the sink current $I_S$ from the feedback node FB to a ground. According to an embodiment of the invention, the pass transistor 320 is an N-type transistor, and the overdrive of the pass transistor 320 is the voltage across the gate terminal and the source terminal. According to another embodiment of the invention, the pass transistor 320 is a P-type transistor, and the overdrive of the pass transistor 320 is the voltage across the gate terminal and the source terminal as well. Since the current I flowing through the Y-path gate 340 is determined by the pass transistor 320, the current detector 360 sensing the overdrive of the pass transistor 320 is equivalent to directly sensing the current I flowing through the Y-path gate 340.

Figure 4:
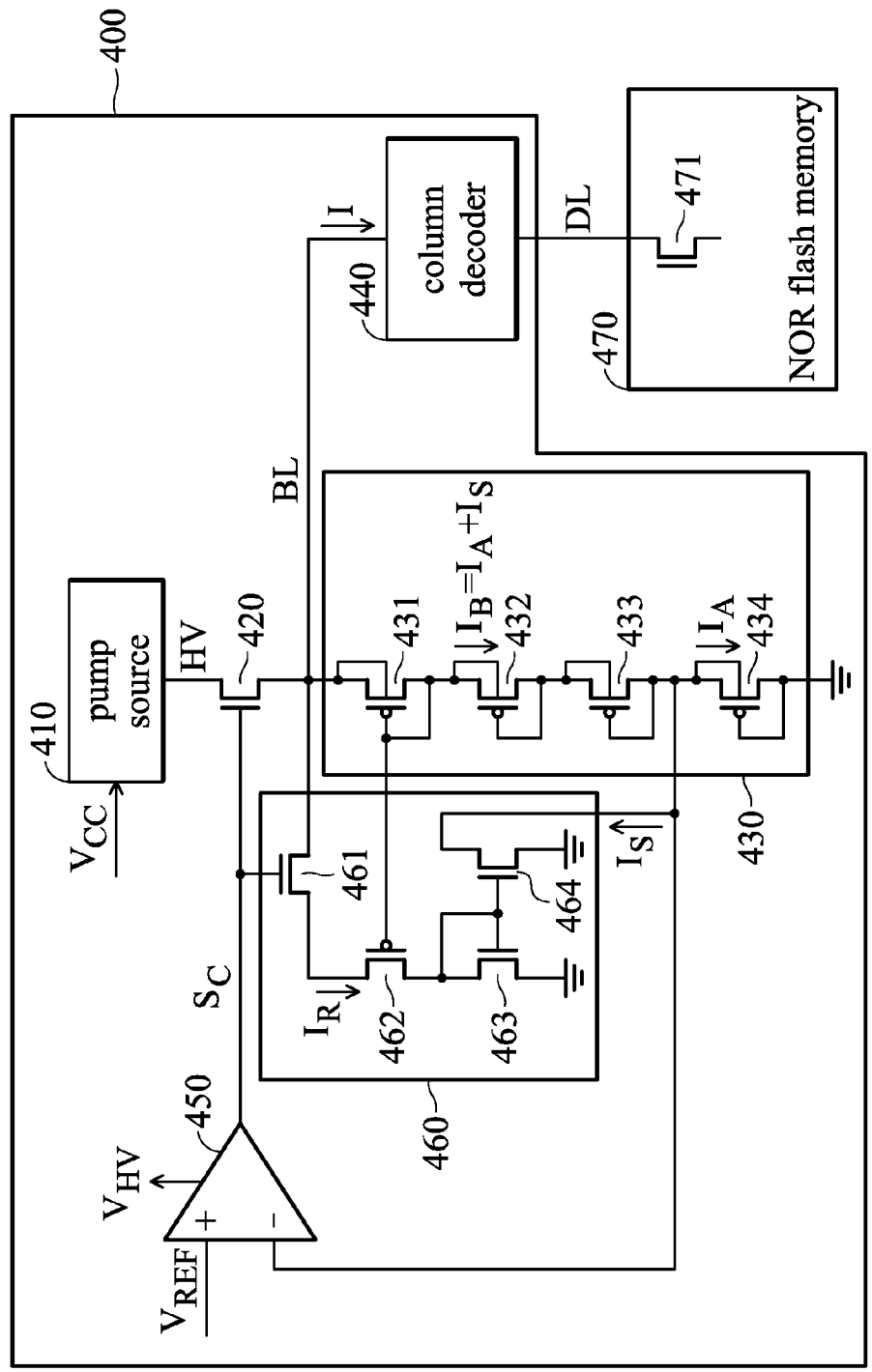
FIG. 4 is a schematic diagram of the column decoder in FIG. 3 in accordance with an embodiment of the invention.

FIG. 4 is a schematic diagram of the drain regulator for a NOR flash memory in accordance with an embodiment of the invention. The drain regulator 400 is an embodiment of the drain regulator 300 in FIG. 3. The pump source 410 pumps the supply voltage $V_{Cc}$ to generate the high voltage $V_{HV}$ at the high voltage node HV. According to an embodiment of the invention, the pass transistor 320 in FIG. 3 is replaced by the N-type power transistor 420.

The voltage divider 430 includes the first diode-connected P-type transistor 431, the second diode-connected P-type transistor 432, the third diode-connected P-type transistor 433, and the fourth diode-connected P-type transistor 434. In order to ensure that the first diode-connected P-type transistor 431, the second diode-connected P-type transistor 432, the third diode-connected P-type transistor 433, and the fourth diode-connected P-type transistor 434 are identical, their body terminals are respectively connected to their own source terminals.

According to the embodiment of the invention, the bit line voltage $V_{BL}$ of the bit line BL is divided by a factor to generate the feedback voltage $V_{FB}$. In the embodiment of FIG. 4, the factor is 4. However, the factor can be any natural number determined by the designer. According to another embodiment of the invention, the voltage divider 330 includes a first resistance unit with a first resistance and a second resistance unit with a second resistance. The bit line voltage $V_{BL}$ is divided by the ratio of the second resistance to the total of the first and second resistances to generate the feedback voltage $V_{FB}$.

According to an embodiment of the invention, the amplifier 350 in FIG. 3 is the operational amplifier 450 which is supplied with the high voltage $V_{HV}$. The operational amplifier 450 compares the feedback voltage $V_{FB}$ of the feedback node FB with the reference voltage $V_{REF}$ to generate the control signal $S_C$. The N-type power transistor 420 determines the current I flowing through the Y-path gate 440 based on the voltage difference between the control signal $S_C$ and the bit line voltage $V_{BL}$, and one with skill in the art knows the voltage difference between the control signal $S_C$ and the bit line voltage $V_{BL}$ is named as the overdrive of the N-type power transistor 420.

The current detector 460 includes the first N-type transistor 461, the first P-type transistor 462, the second N-type transistor 463, and the third N-type transistor 464. The first N-type transistor 461 is controlled by the control signal $S_C$ and coupled to the bit line BL. The first N-type transistor 461 sinks the reference current $I_R$ from the N-type power transistor 420 based on the control signal $S_C$. The first P-type transistor 462 is coupled to the first N-type transistor 461 and biased by the gate terminal of the first diode-connected P-type transistor 431. According to another embodiment of the invention, the first P-type transistor 462 can be biased by an additional bias voltage.

The second N-type transistor 463 and the third N-type transistor 464 are formed as a current mirror. The second N-type transistor 463 is diode-connected, and the gate terminal of the second N-type transistor 463 is coupled to that of the third N-type transistor 464. The third N-type transistor 464 sinks the sink current $I_S$ from the feedback node FB. The ratio of the sink current $I_S$ to the reference current $I_R$ is proportional to the dimension ratio of the third N-type transistor 464 to the second N-type transistor 463. For the sake of the convenience of explanation, the ratio of the sink current $I_S$ to the reference current $I_R$ is 1. That is, the sink current $I_S$ is equal to the reference current $I_R$.

Figure 5:
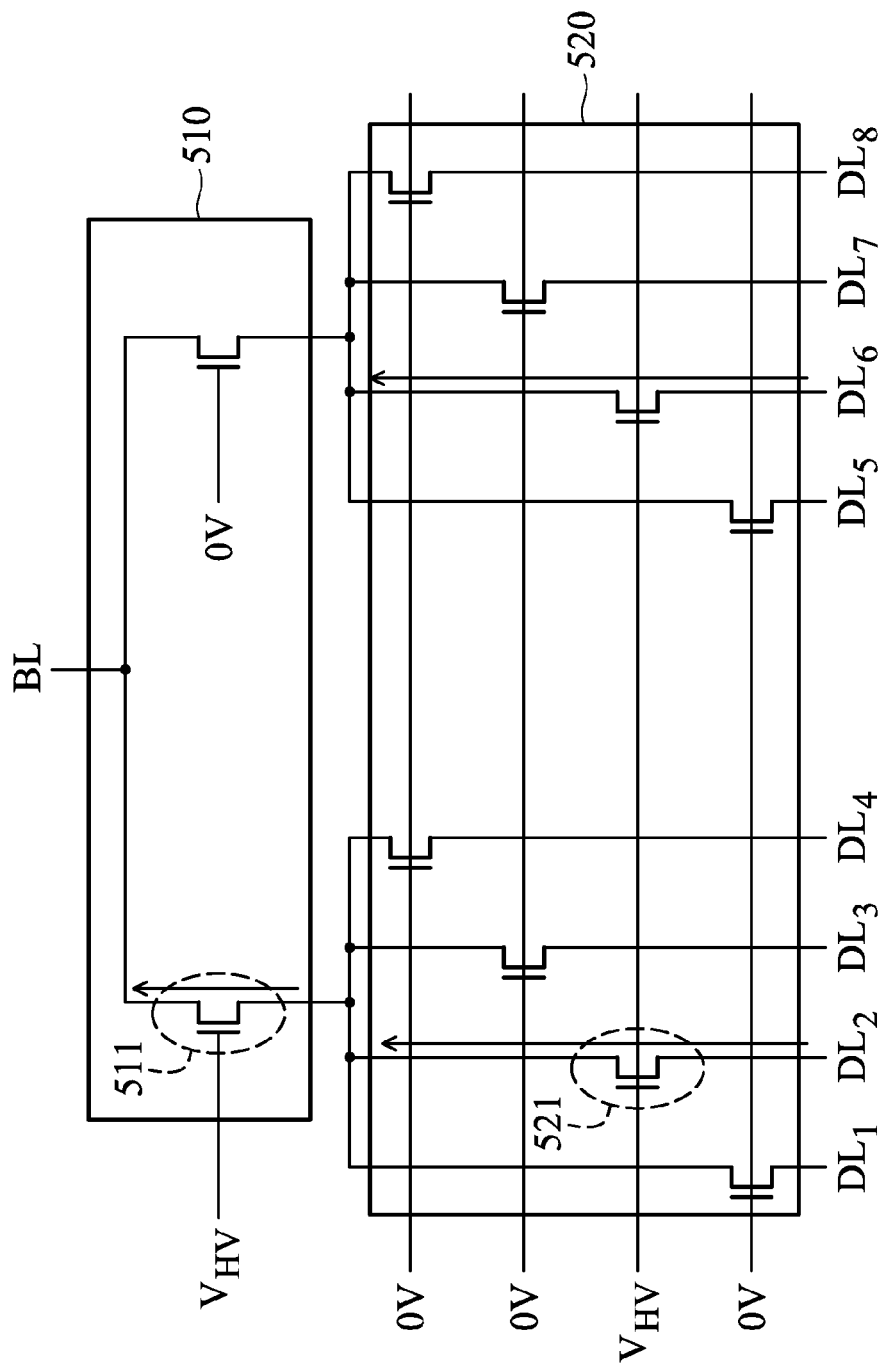
FIG. 5 shows the NOR flash memory array according to an embodiment of the NOR flash memory in FIG. 3 of the invention.

According to an embodiment of the invention, the Y-path gate 340 in FIG. 3 is the column decoder 440. FIG. 5 is a schematic diagram of the column decoder in FIG. 4 in accordance with an embodiment of the invention. As shown in FIG. 5, the column decoder 440 includes the first MUX 510 and the second MUX 520. When the second drain line $DL_2$ in FIG. 5 is going to be selected, the switch 511 in the first MUX 510 and the switch 521 in the second MUX 520 are applied with the high voltage $V_{HV}$, and the others are applied with 0V or any negative voltage to deselect, such that the cell 1 is selected. Therefore, the column decoder 440 can be modeled as two MOS in series during programming.

Figure 6:
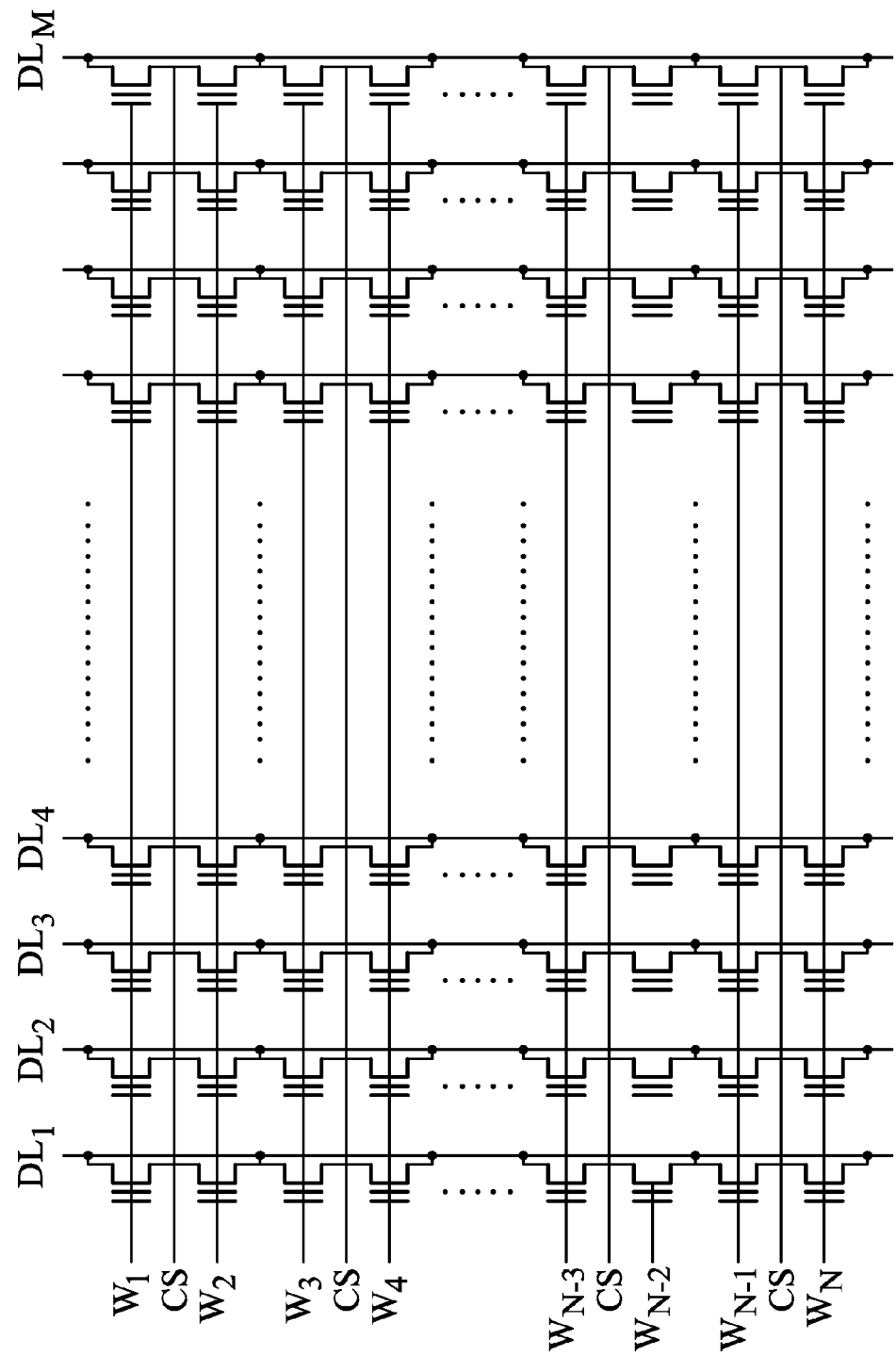
FIG. 6 shows the NOR flash memory array according to an embodiment of the NOR flash memory.

FIG. 6 shows the NOR flash memory array according to an embodiment of the NOR flash memory in FIG. 4 of the invention. As shown in FIG. 6, the NOR flash memory 470 includes M drain lines $DL_1 \sim DL_M$ and N word lines $W_1 \sim W_N$. The common source CS in FIG. 6 is coupled to the ground. When the second drain line $DL_2$ and the second word line $W_2$ are selected, the selected cell 471 is then selected. According to an embodiment of the invention, the word lines other than the second word line $W_2$ are coupled to the ground. According to another embodiment of the invention, the word lines other than the second word line $W_2$ are coupled to a negative voltage for reducing the leakage current of the unselected cells along the selected second word line $W_2$.

As mentioned before, the column decoder 440 in FIG. 4 is modeled as two MOS in series. However, the current I flows through the column decoder 440 to the selected cell 471, such that the drain voltage $V_D$ of the drain line DL in FIG. 4 is lower to the bit line voltage $V_{BL}$ by the current I multiplied by the total resistance of two MOS of the column decoder 440 and the bit line.

In addition, the range of current I is very wide. According to an embodiment of the invention, the current I is 270 μA and the drain voltage $V_D$ is 3.4V when the memory cells of the selected drain line are all erase cells. According to another embodiment of the invention, the current I is 70 μA and the drain voltage $V_D$ is 4.1V when all of them are program cells. That is, the current I is from 70 μA to 270 μA, and the drain voltage $V_D$ is from 3.4V to 4.1V. According to an embodiment of the invention, the drain voltage $V_D$ is typically 4V. When the drain voltage is lowered to 3.4V, the programming performance is definitely much poorer.

As the current I increases, the control signal $S_C$ becomes higher, and the overdrive, the gate-to-source voltage of the N-type power transistor 420, becomes higher. The first N-type transistor 461 senses the control signal $S_C$ to generate the reference current $I_R$. With the higher voltage level of the control signal $S_C$, the larger reference current $I_R$ is generated. Since the ratio of the reference current $I_R$ to the sink current $I_S$ is 1 according to an embodiment of the invention, the sink current $I_S$ equals the reference current $I_R$.

Since the current $I_B$ flows through both the first diode-connected P-type transistor 431, the second diode-connected P-type transistor 432, and the third diode-connected P-type transistor 433, the current flowing through the transistors 431, 432, and 433 is increased from the current $I_A$ to the current $I_A$ plus the sink current $I_S$. Assuming the resistance of the first diode-connected P-type transistor 431, the second diode-connected P-type transistor 432, and the third diode-connected P-type transistor 433 remain the same, the bit line voltage $V_{BL}$ is raised due to a higher voltage drop across the first diode-connected P-type transistor 431, the second diode-connected P-type transistor 432, and the third diode-connected P-type transistor 433. The voltage drop due to the current I flowing through the column decoder 440 is thus compensated.

According to an embodiment of the invention, the drain voltage $V_D$ is increased from 3.4V to 4V. Therefore, the program performance is greatly improved by the current detector 460 in FIG. 4.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A drain regulator for a NOR flash memory, comprising:
   a pump source, configured to pump a supply voltage to a high voltage at an HV node;
   a pass transistor, coupled between the HV node and a bit line, wherein the pass transistor is controlled by a control signal to generate a bit-line voltage at the bit line;
   a voltage divider, dividing the bit-line voltage by a factor to generate a feedback voltage at a feedback node;
   a Y-path gate, coupled between the bit line and a selected cell of the NOR flash memory and biasing the selected cell with a drain voltage;
   an amplifier, supplied with the HV voltage and comparing the feedback voltage with a reference voltage to generate the control signal; and
   a current detector, sensing a current flowing through the Y-path gate to generate a sense signal to the feedback node for keeping the drain voltage constant.

2. The drain regulator of claim 1, wherein the voltage divider comprises:
   a first resistance unit, comprising a first resistance and coupled between the bit line and the feedback node; and
   a second resistance unit, comprising a second resistance and coupled between the feedback node and a ground, wherein the factor is the second resistance divided by a sum of the first resistance and the second resistance.

3. The drain regulator of claim 1 wherein the Y-path gate is a column decoder configured to select the bit line.

4. The drain regulator of claim 1 wherein the amplifier is an operational amplifier.

5. The drain regulator of claim 1, wherein the pass transistor is a first N-type transistor, wherein the current detector comprises:
   a second N-type transistor, comprising a gate terminal coupled to the control signal, a drain terminal coupled to the bit line, and a source terminal; and
   a current mirror, comprising a current sink node sinking a sink current and a current reference node sinking a reference current, wherein the current sink node is coupled to the feedback node and the current reference node is coupled to the source terminal of the second N-type transistor, wherein the sink current is the reference current multiplied by a predetermined number.

6. The drain regulator of claim 5, wherein the current mirror comprises:
   a first P-type transistor, comprising a gate terminal with a bias voltage applied, a drain terminal, and a source terminal coupled to the source terminal of the second N-type transistor;
   a third N-type transistor, comprising a gate terminal coupled to a drain terminal and a source terminal coupled to a ground; and
   a fourth N-type transistor, comprising a gate terminal coupled to the gate terminal of the third N-type transistor, a drain terminal coupled to the feedback node, and a source terminal coupled to the ground.

7. A drain regulator for a NOR flash memory, comprising:
   a pump source, configured to pump a supply voltage to a high voltage at a HV node;
   a pass transistor, coupled between the HV node and a bit line, wherein the pass transistor is controlled by a control signal to generate a bit-line voltage at the bit line;
   a voltage divider, dividing the bit-line voltage by a factor to generate a feedback voltage at a feedback node;
   a Y-path gate, coupled between the bit line and a selected cell of the NOR flash memory and biasing the selected cell with a drain voltage, wherein a current flowing through the Y-path gate is determined by an overdrive of the pass transistor;
   an amplifier, supplied with the HV voltage and comparing the feedback voltage with a reference voltage to generate the control signal; and
   a current detector, sensing the overdrive of the pass transistor to sink a sink current from the feedback node to a ground.

8. The drain regulator of claim 7, wherein the voltage divider comprises:
   a first resistance unit, comprising a first resistance and coupled between the bit line and the feedback node; and
   a second resistance unit, comprising a second resistance and coupled between the feedback node and a ground, wherein the factor is the second resistance divided by a sum of the first resistance and the second resistance.

9. The drain regulator of claim 7 wherein the Y-path gate is a column decoder configured to select the bit line.

10. The drain regulator of claim 7 wherein the amplifier is an operational amplifier.

11. The drain regulator of claim 7, wherein the pass transistor is a first N-type transistor, wherein the current detector comprises:
    a second N-type transistor, comprising a gate terminal coupled to the control signal, a drain terminal coupled to the bit line, and a source terminal; and
    a current mirror, comprising a current sink node sinking a sink current and a current reference node sinking a reference current, wherein the current sink node is coupled to the feedback node and the current reference node is coupled to the source terminal of the second N-type transistor, wherein the sink current is the reference current multiplied by a predetermined number.

12. The drain regulator of claim 11, wherein the current mirror comprises:
    a first P-type transistor, comprising a gate terminal with a bias voltage applied, a drain terminal, and a source terminal coupled to the source terminal of the second N-type transistor;
    a third N-type transistor, comprising a gate terminal coupled to a drain terminal and a source terminal coupled to a ground; and
    a fourth N-type transistor, comprising a gate terminal coupled to the gate terminal of the third N-type transistor, a drain terminal coupled to the feedback node, and a source terminal coupled to the ground.

* * * * *